United States Patent [19]

Rijckaert

[11] 4,370,619
[45] Jan. 25, 1983

[54] PHASE COMPARISON CIRCUIT ARRANGEMENT

[75] Inventor: Albert M. A. Rijckaert, Eindhoven, Netherlands

[73] Assignee: U.S. Philips Corporation, New York, N.Y.

[21] Appl. No.: 168,841

[22] Filed: Jul. 10, 1980

[30] Foreign Application Priority Data

Jul. 17, 1979 [NL] Netherlands ............... 7905541

[51] Int. Cl.$^3$ ............... H03D 13/00; H03K 19/21; H03K 5/26
[52] U.S. Cl. .................................. 328/133; 328/151
[58] Field of Search ............... 328/133, 134, 151; 307/514, 516

[56] References Cited

U.S. PATENT DOCUMENTS

| 3,535,658 | 10/1970 | Webb | 328/151 X |
| 3,541,320 | 11/1970 | Beall | 328/151 X |
| 3,688,211 | 8/1972 | Calaway | 328/133 X |
| 4,068,181 | 1/1978 | Clark et al. | 328/133 |

Primary Examiner—John S. Heyman
Attorney, Agent, or Firm—Robert T. Mayer; Bernard Franzblau

[57] ABSTRACT

A phase comparison circuit for producing an output signal which is a measure of the phase difference between first (A) and second (B) pulse trains applied to respective first and second inputs thereof. The circuit is immune to the omission of a pulse from one of the trains and to pulse length inequality in the two trains. It comprises a logic circuit, two switchable current sources connected to a capacitor (17), a switchable constant voltage source, i.e. a controllable switch (18) connected to the capacitor, and a sampling circuit connected to the capacitor. The logic circuit generates four output signals that control the first current source, the second current source, the constant voltage source, and the sampling circuit respectively so that the charge on the capacitor is changed in a positive sense by the first current source when a pulse of the first train is present while a pulse of the second train is absent and in the other sense by the second current source when a pulse of the second train is present while a pulse of the first train is absent. The capacitor charge is restored to a reference value (zero) by the constant voltage source when pulses of both trains are absent simultaneously. The sampling circuit samples the capacitor voltage when pulses of both trains are present simultaneously.

6 Claims, 4 Drawing Figures

PHASE COMPARISON CIRCUIT ARRANGEMENT

The invention relates to a phase comparison circuit arrangement constructed to generate at an output thereof a signal which is a measure of the phase difference between first and second pulse trains applied to first and second inputs thereof, respectively.

In a known phase comparison circuit arrangement of this kind, a ramp generator is started by each pulse of the second pulse train. A pulse of the first pulse train which appears during the generation of a ramp in response to the occurrence of a pulse of the second pulse train causes a sampling circuit to sample the output signal of the generator and the value of the sample obtained is a measure of the time difference between the two pulses and hence of the instantaneous phase difference between the two pulse trains. In order to enable the phase difference to be determined also when the pulses of the first pulse train lead those of the second pulse train (negative phase), the pulses of the first pulse train are applied to the sampling circuit after having been delayed by a period of time which corresponds to half the nominal period of the second pulse train. When the phase difference equals zero, the value of the sample taken by the sampling circuit corresponds to the value of the generated sawtooth halfway through a period of the sawtooth.

This known phase comparison circuit has the drawback that the accuracy with which phase differences around zero can be determined is determined by the accuracy with which the aforesaid delay is equal to a half-period of the sawtooth. Moreover, if this delay is fixed, the phase comparison circuit only operates satisfactorily when the pulse trains have a particular frequency, because deviations from this frequency give rise to changes in the values of the samples obtained when the phase difference is equal to zero.

The invention has for an object to provide a phase comparison circuit arrangement of the kind set forth in the opening paragraph which need not have these drawbacks.

The invention provides a phase comparison circuit arrangement constructed to generate at an output thereof a signal which is a measure of the phase difference between first and second pulse trains applied to first and second inputs thereof, respectively. The arrangement comprises first and second activatable current sources having their outputs connected to said capacitor, an activatable constant voltage source connected to said capacitor, a sampling circuit having an input to which said capacitor is connected, and a control circuit having inputs to which said first and second inputs are coupled and outputs which are coupled to activation signal inputs of said current sources, said constant voltage source and said sampling circuit. The constant voltage source is constructed to produce, when activated, an output voltage which lies between the open-circuit output voltages of said first and second current sources and said control circuit is constructed to respond to the application of first and second pulse trains to said first and second inputs respectively by (a) activating said first current source for periods when a pulse of the first pulse train is present while a pulse of the second pulse train is absent, (b) activating said second current source for periods when a pulse of the second pulse train is present while a pulse of the first series is absent, (c) activating said constant voltage source each time a pulse of the first pulse train is absent while a pulse of the second pulse train is absent, and (d) activating said sampling circuit each time a pulse of the first pulse train is present while a pulse of the second pulse train is present.

Statements concerning the presence or absence of a pulse in a given pulse series are used herein merely to distinguish between times when the relevant signal has one of its two possible levels and times when it has the other of these levels. Thus the relevant signal may have either a higher or a lower actual level when a pulse is "present" therein than it has when such a pulse is absent.

The output voltage of one of the three said sources may be zero.

Such an arrangement need not incorporate either a delay device or a ramp generator, so that the aforesaid drawbacks need not occur. Moreover, such an arrangement is not susceptible to variations in the frequency of the two pulse trains. Furthermore, its correct operation need not be disturbed by the occasional omission of pulses from one or both of the pulse trains.

An embodiment of the invention will be described in detail hereinafter, by way of example, with reference to the accompanying diagrammatic drawing, in which.

Figure 1:
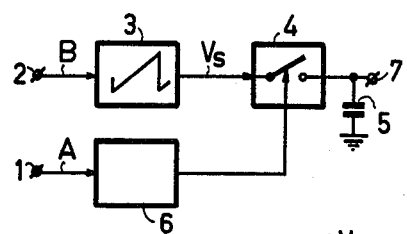
FIG. 1 shows a known phase comparison circuit.

FIG. 1 shows a known phase comparison circuit which has a first input 1 and a second input 2 for receiving first (A) and second (B) pulse trains, respectively. In a motor control system, for example, the pulse series B may be a reference pulse series and the pulse series A may be a pulse series originating from a tachogenerator. The input 2 is connected to a ramp generator 3 which is reset each time a pulse appears at the input 2. The input 1 is connected via a delay network 6, which produces a delay equal to half the nominal period of the sawtooth $V_S$ appearing at the output of ramp generator 3 when the pulse series B is applied to the input 2, to the control input of a (preferably electronic) switch 4 which briefly connects a sampling capacitor 5 to the output of the ramp generator 3 each time a pulse appears. The voltage on the capacitor 5 is fed to an output 7.

The operation of the circuit shown in FIG. 1 is as follows. A pulse of the pulse series B applied to the input 2 starts the generation of a voltage ramp. When the switch 4 is briefly closed at a given instant due to the appearance at its control input of a pulse of the pulse series A which occurred at input 1 a period of time equal to the delay produced by the network 6 before this instant, the voltage across the capacitor 5 and hence at the output 7 becomes equal to the value of the ramp at this instant. This value is linearly proportional to the time difference between the instant at which the ramp started and the instant at which its value is sampled. This time difference minus the delay produced by the network 6 is proportional to the phase difference between the pulse series A and B, the value of the sawtooth being sampled halfway through each period thereof if this phase difference is equal to zero, provided that the delay produced by the network 6 corresponds to exactly half this period.

Figure 2:
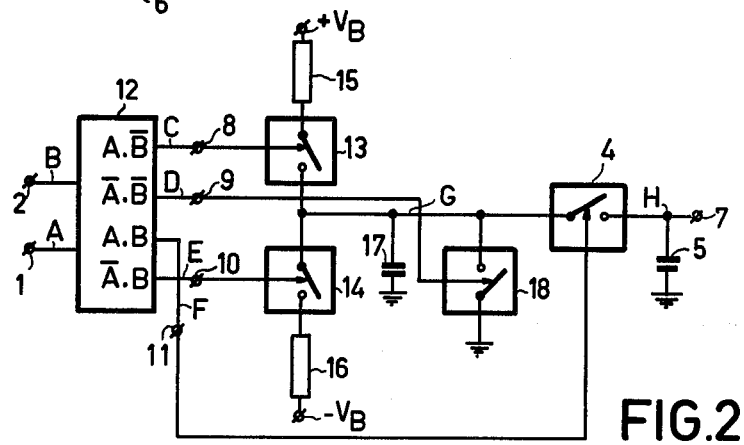
FIG. 2 shows an embodiment of the invention.

In the embodiment of the invention shown in FIG. 2, a phase comparison circuit comprises a logic gate circuit 12 having inputs 1 and 2 to which the pulse series A and B, respectively, are applied. The gate circuit 12 has outputs 8, 9, 10 and 11 at which signals C, D, E and F, respectively, occur in operation, where these signals are given in terms of the signals A and B by the following logic relations:

$C = A.\bar{B}$.
$D = \bar{A}.\bar{B}$.
$E = \bar{A}.B$.
$F = A.B$.

The circuit furthermore comprises a capacitor 17 across which a signal G occurs in operation. This capacitor 17 is connected, via a switch 13 which is controlled by the signal C, and a resistor 15, to a terminal carrying a positive voltage $+V_B$, and via a switch 14, controlled by the signal E, and a resistor 16, to a terminal carrying a negative voltage $-V_B$. The combinations 13, 15, $+V_B$ and 14, 16, $-V_B$ thus constitute first and second activatable (switchable) current sources, respectively. A switch 18 which is controlled by the signal D is connected in parallel with the capacitor 17. Switch 18 effectively constitutes an activatable (switchable) constant voltage source the output voltage of which is zero. The voltage G across the capacitor 17 can be sampled in that the capacitor 17 is connected, via a switch 4 which is controlled by the signal F, to an output 7 to which a sampling capacitor 5 is connected. A voltage H occurs across the latter capacitor in operation. All the switches 4, 13, 14 and 18 are closed when their respective control signals are logic "1" and are open otherwise.

Figure 3:
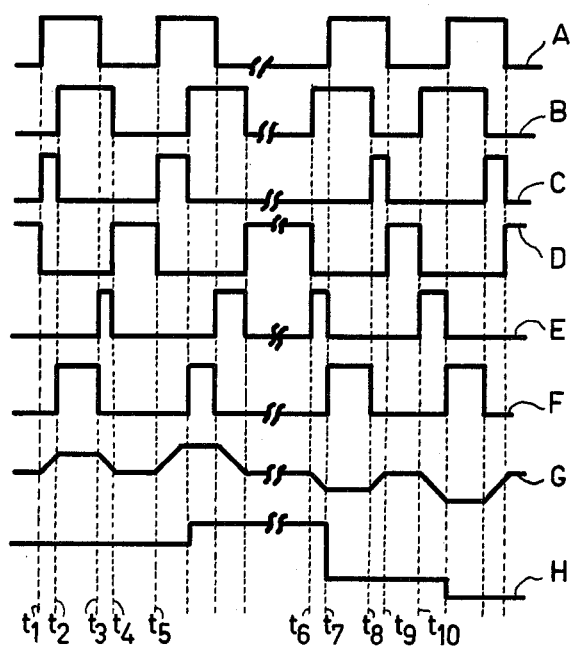
FIG. 3 shows a number of waveforms which illustrate the operation of the embodiment shown in FIG. 2.

FIG. 3 shows the time relation between the signals A to H for two different situations, i.e. a situation where the pulse series A leads the pulse series B, and the situation where the pulse series B leads the pulse series A.

If the leading edge of the pulse of the pulse series A occurs at the instant $t_1$, the signal C becomes high (logic "1") until the leading edge of a pulse of the pulse series B occurs at the instant $t_2$, at which instant the signal C becomes low again. During the period between $t_1$ and $t_2$, therefore, the capacitor 17 is connected, via the switch 13 and the resistor 15, to the positive voltage $+V_B$, and the voltage G across the capacitor 17 increases (from zero) to a value determined by the time difference $t_2 - t_1$ and hence by the phase difference between the pulse series A and B. Between the instant $t_2$ and the instant $t_3$ at which the trailing edge of the pulse of the series A occurs, the signal F is high and the switch 4 is therefore closed so that the capacitor 5 is charged to the level of the voltage G across the capacitor 17, provided that its capacitance is negligibly small with respect to the capacitance of the capacitor 17. Between the instant $t_3$ and the instant $t_4$ at which the trailing edge of the pulse series B occurs, the signal E is high and the capacitor 17 is therefore connected, via the switch 14 and the resistor 16, to the negative voltage $-V_B$, so that the capacitor 17 discharges. If the widths of the pulses of the series A and B are equal, the values of the resistors 15 and 16 are equal, and the voltages $+V_B$ and $-V_B$ are equal, the capacitor 17 discharges to substantially the original level (zero). Between the instants $t_4$ and $t_5$, the signal D is high due to the absence of pulses on the inputs 1 and 2 so that the capacitor 17 is short-circuited via the switch 18, with the result that any remaining charge on the capacitor 17 is removed and the voltage thereacross becomes exactly equal to zero.

Similar operations occur at the instants $t_6$ to $t_{10}$ as occur at the instants $t_1$ to $t_5$. However, because the signal B now leads the signal A, the capacitor 17 is charged in a negative sense between the instants $t_6$ and $t_7$ rather than in a positive sense, so that a negative value of the signal G is sampled between the instants $t_7$ and $t_8$. The capacitor 17 is subsequently discharged between the instants $t_8$ and $t_9$.

The sampling under the control of the signal F offers the advantage that, if a pulse of the pulse series A or B is omitted, no sample is taken preventing an incorrect value from being sampled.

The resetting of the charge on the capacitor 17 to zero by means of the switch 18 offers the advantage that any inequality between the widths of the pulses of the pulse series A and B, between the values of the resistors 15 and 16, and between the values of the voltages $+V_B$ and $-V_B$ will not result in a residual voltage occurring across the capacitor 17 at the end of each cycle of operation, which voltage would influence the value of the sample taken during the next cycle. This resetting also prevents such a residual voltage from occurring if a pulse of the signal A or B should be missing.

The circuit shown in FIG. 2 can be improved in many respects, if desired, although at the expense of simplicity. For example, in order to improve the linearity of the relationship between the voltage produced across the capacitor 17 and the time during which the switch 13 or 14 is closed, the resistors 15 and 16 together with the switches 13 and 14 can be replaced by switched constant current sources. Moreover, in order to prevent the sampling capacitor 5 from loading the capacitor 17 during the sampling operations, a buffer amplifier may be included between the capacitor 17 and the capacitor 5.

Figure 4:
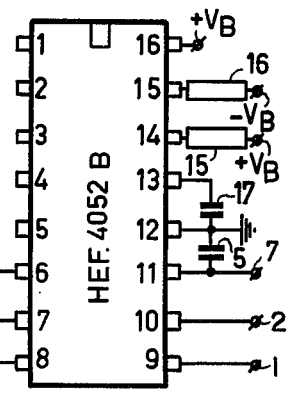
FIG. 4 shows how the embodiment of FIG. 2 can be realized using a commercially available integrated logic circuit.

FIG. 4 shows how the circuit shown in FIG. 2 can be realized using an integrated circuit available under the Philips type number HEF 4052B, which integrated circuit is described in Philips Datahandbook, Semiconductors and Integrated Circuits, Part 6, October 1977. Pins 1 to 5 of the integrated circuit are not used, pins 6, 8 and 12 are connected to ground, pin 7 is connected to the negative supply voltage $-V_B$, pin 16 is connected to the positive supply voltage $+V_B$, pin 15 is connected, via the resistor 16, to the negative supply voltage $-V_B$, pin 14 is connected, via the resistor 15, to the positive supply voltage $+V_B$, pin 13 is connected to ground via the capacitor 17, pin 11 is connected to the output 7 and, via the capacitor 5, to ground, pin 10 is connected to the input 2, and pin 9 is connected to the input 1. If desired, the phase comparison circuit shown in FIG. 4 can be deactivated by switching the pin 6 from ground to $+V_B$ by means of a switch (not shown).

What is claimed is:

1. A phase comparison circuit for measuring the phase difference between first and second pulse trains comprising, first and second inputs for receiving said first and second pulse trains, respectively, a capacitor, first and second switchable current sources having outputs connected to said capacitor, a switchable constant voltage source connected to said capacitor, a sampling circuit coupled to said capacitor, and a control circuit having input means coupled to said first and second inputs and output means coupled to switching signal inputs of said current sources, said constant voltage source and said sampling circuit, said constant voltage source being arranged to produce, when activated, an output voltage which lies between the open circuit output voltages of said first and second current sources, said control circuit being responsive to first and second pulse trains applied to said first and second inputs, respectively, by (a) activating said first current source for periods when a pulse of the first pulse train is present while a pulse of the second pulse train is absent, (b) activating said second current source for periods when a pulse of the second pulse train is present while a pulse of the first pulse train is absent, (c) activating said constant voltage source each time pulses of the first and second pulse trains are absent simultaneously, and (d) activating said sampling circuit each time pulses of the first and second pulse trains are present simultaneously.

2. A phase comparison circuit as claimed in claim 1, wherein the control circuit comprises a logic gate circuit adapted to respond to logic signals A and B applied to said first and second inputs respectively, by forming the signals $A \cdot \overline{B}$, $\overline{A} \cdot B$, $\overline{A} \cdot \overline{B}$ and $A \cdot B$ at first, second, third and fourth outputs of said output means, respectively, said outputs being connected to the switching signal inputs of the first current source, the second current source, the constant voltage source, and the sampling circuit, respectively.

3. A phase comparison circuit for determining the phase difference between a first source of periodic signals and a second source of periodic signals comprising, a control circuit having input means adapted to receive signals from said first and second periodic signal sources and output means providing first, second, third and fourth control signals, an energy storage device, first and second current sources of opposite polarity, switching means responsive to the first and second control signals at the control circuit output means for selectively coupling the first current source to the storage device when the first periodic signal is present and the second periodic signal is absent and selectively coupling the second current source to the storage device when the second periodic signal is present and the first periodic signal is absent, a source of reference voltage intermediate in value the voltages of the first and second current sources, a switch responsive to the third control signal at the control circuit output means for selectively coupling the storage device to said reference voltage source when the first and second periodic signals are absent simultaneously, and a sampling circuit responsive to said fourth control signal for selectively coupling the storage device to an output terminal when the first and second periodic signals are present simultaneously at the control circuit input means.

4. A phase comparison circuit as claimed in claim 3 wherein said first and second source of periodic signals comprise rectangular waveform signals, said energy storage device includes a capacitor, said first and second current sources comprise a voltage source providing a positive and negative voltage and said switching means comprise first and second switching devices selectively coupling the positive and negative voltages, respectively, of the voltage source to said capacitor under control of the first and second control signals, respectively.

5. A phase comparison circuit as claimed in claim 3 wherein said storage device includes a capacitor and said source of reference voltage comprises circuit ground whereby said switch selectively couples the capacitor to circuit ground to discharge the capacitor under control of the third control signal.

6. A phase comparison circuit as claimed in claim 3 wherein said storage device comprises a capacitor and said first and second current sources each include resistance means arranged to form a linear charge circuit and a linear discharge circuit, respectively, for said capacitor.

* * * * *